US011126548B1

(12) United States Patent
Yudanov

(10) Patent No.: US 11,126,548 B1
(45) Date of Patent: Sep. 21, 2021

(54) ACCELERATED IN-MEMORY CACHE WITH MEMORY ARRAY SECTIONS HAVING DIFFERENT CONFIGURATIONS

(71) Applicant: Micron Technology, Inc., Boise, ID (US)

(72) Inventor: Dmitri Yudanov, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/824,618

(22) Filed: Mar. 19, 2020

(51) Int. Cl.
*G06F 12/06* (2006.01)
*G06F 12/0877* (2016.01)
*G11C 11/4091* (2006.01)
*G11C 11/4094* (2006.01)
*G06F 13/16* (2006.01)

(52) U.S. Cl.
CPC ...... *G06F 12/0646* (2013.01); *G06F 12/0877* (2013.01); *G06F 13/1694* (2013.01); *G11C 11/4091* (2013.01); *G11C 11/4094* (2013.01); *G06F 2212/1024* (2013.01)

(58) Field of Classification Search
None
See application file for complete search history.

(56) References Cited

U.S. PATENT DOCUMENTS

| | | | | |
|---|---|---|---|---|
| 5,625,602 A | * | 4/1997 | Hasegawa | G11C 7/1051 365/149 |
| 2002/0018359 A1 | * | 2/2002 | Mizuno | G06F 12/0893 365/154 |
| 2014/0025880 A1 | * | 1/2014 | Yu | G11C 11/403 711/105 |
| 2014/0146589 A1 | * | 5/2014 | Park | G11C 11/4076 365/51 |

* cited by examiner

*Primary Examiner* — J. H. Hur
(74) *Attorney, Agent, or Firm* — Greenberg Traurig

(57) ABSTRACT

An apparatus having a memory array. The memory array having a first section and a second section. The first section of the memory array including a first sub-array of memory cells made up of a first type of memory. The second section of the memory array including a second sub-array of memory cells made up of the first type of memory with a configuration to each memory cell of the second sub-array that is different from the configuration to each cell of the first sub-array. Alternatively, the section can include memory cells made up of a second type of memory that is different from the first type of memory. Either way, the second type of memory or the differently configured first type of memory has memory cells in the second sub-array having less memory latency than each memory cell of the first type of memory in the first sub-array.

7 Claims, 7 Drawing Sheets

100

Storage Part
104

Cut-off Part
106

In-memory Cache Part
102

SA Array
108

Storage Part
104

Cut-off Part 106

In-memory Cache Part
102

SA Array
108

Storage Part
204

Cut-off Part 206

In-memory Cache Part
202

SA Array
208

FIG. 2

ACCELERATED IN-MEMORY CACHE WITH MEMORY ARRAY SECTIONS HAVING DIFFERENT CONFIGURATIONS

FIELD OF THE TECHNOLOGY

At least some embodiments disclosed herein relate to in-memory cache. Also, at least some embodiments relate to accelerated in-memory cache, accelerated scratchpad memory, and enhancements to page tables as well as page migration.

BACKGROUND

A cache is a hardware or software component that temporarily stores data. Caches are designed for faster access to temporarily stored data. Thus, requests for data can be served faster by a cache than a non-cache storage element. Data stored in a cache can be a result of a computation and data stored in a cache is often copied to a less temporary storage component.

A cache hit occurs when a requester requests to read or write data from or to a cache and the data is found in the cache. A cache miss occurs when the data requested cannot be found in the cache. Cache hits are served by reading data from the cache or writing data to the cache, which is faster than re-computing a result or reading from or writing to a slower data storage element. Therefore, the more requests that can be served from or to a cache dictates the speed of the cache and the system using the cache.

Computer hardware can implement cache as a block of memory for temporary storage of data probable to be used again. Data processors, such as central processing units (CPUs), and more permanent storage components, such as hard disk drives (HDDs), frequently use a cache.

A cache can include a pool of entries, and each entry of the pool can have associated data. The associated data can be a copy of the same data in more permanent data storage. Typically, each entry in a cache has a tag that specifies the identity of the data in the more permanent data storage of which the entry is a copy.

When hardware attempts to access data presumed to exist in an associated data storage component, the hardware can first check the cache associated with the data storage component. If an entry can be found in the cache with a tag matching that of the data in the storage component, the data in the entry of the cache is used instead. Such as successful match can be considered a cache hit. The percentage of accesses that result in cache hits is considered the hit rate of the cache. On the other hand, when the tag matching is unsuccessful, such a mismatch is considered a cache miss. A cache miss can be costly because it can force a requestor of data to access data in the more permanent data storage component associated with the cache. In general, it is more resource expensive to access data from the backing store. Once the requested data is retrieved from the storage component associated with the cache, it can be copied into the cache and be ready for a future and faster access attempt.

BRIEF DESCRIPTION OF THE DRAWINGS

The present disclosure will be understood more fully from the detailed description given below and from the accompanying drawings of various embodiments of the disclosure.

FIG. 1 illustrates example memory hardware with an in-memory cache part and an associated data storage part or a backing store part, in accordance with some embodiments of the present disclosure.

FIG. 2 illustrates example memory hardware with multiple in-memory cache parts and respective associated data storage parts or backing store parts, in accordance with some embodiments of the present disclosure.

DETAILED DESCRIPTION

Figure 3:
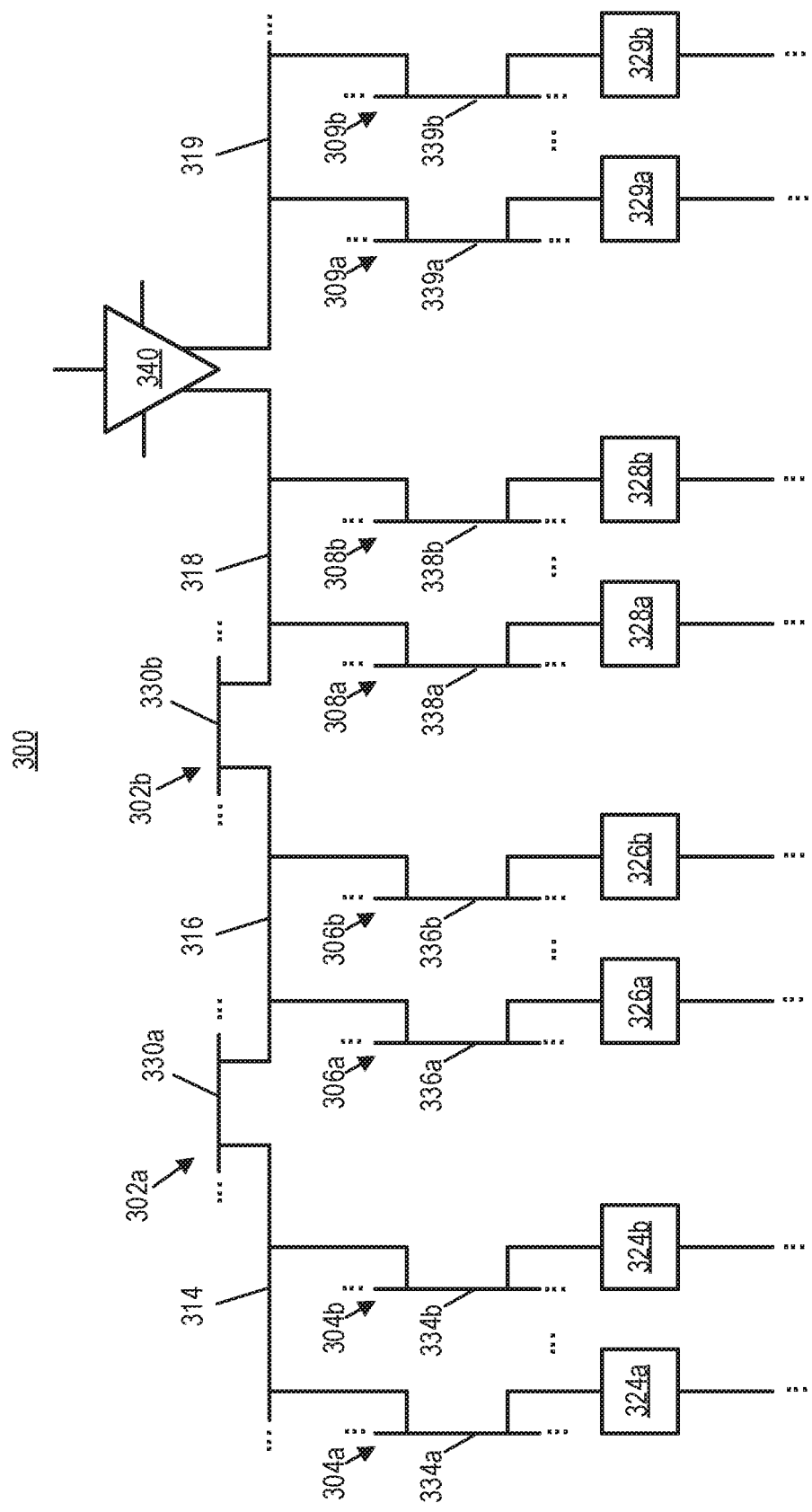
FIG. 3 illustrates a part of a memory cell array that can at least partially implement an in-memory cache and that has pass transistors and access transistors, in accordance with some embodiments of the present disclosure.

At least some embodiments disclosed herein are directed to in-memory cache, and more specifically, at least some embodiments disclosed herein are directed to an accelerated in-memory cache. Although a majority of examples described herein relate to accelerating in-memory cache, it is to be understood that such examples and other embodiments disclosed herein can also be directed to accelerating scratchpad memory, accelerating page migration, enhancement to page tables, etc. It is also to be understood that caching can include duplication of data or data can be exclusively located in a cache.

Some embodiments disclosed herein are directed to an apparatus that has a memory array. The memory array can have at least a first section and a second section. The first section of the memory array can include a first sub-array of memory cells made up of a first type of memory. The second section of the memory array can include a second sub-array of memory cells made up of the first type of memory with a configuration to each memory cell of the second sub-array that is different from the configuration to each cell of the first sub-array. Alternatively, in some embodiments, the second section can include memory cells made up of a second type of memory that is different from the first type of memory. Either way, the second type of memory or the differently configured first type of memory has memory cells in the second sub-array having less memory latency than each memory cell of the first type of memory in the first sub-array to provide faster data access. Thus, in such embodiments and others disclosed herein, the second type of memory and the differently configured first type of memory, in the second sub-array, can be used in different implementations of an in-memory cache.

The in-memory cache or accelerated in-memory cache described herein can provide fast temporal data storage for compute-in-memory solutions or general-purpose access with low data retention. The cache can be a part of a large memory array, and can be made of the same technology. It can accelerate an in-memory compute by orders of magnitude.

For processing-in-memory (PIM), it is often needed to store temporary results of a computation. The technologies described herein can provide a low-cost effective solution in a form of in-memory cache or a register file as an alternative to the in-memory cache.

In some examples, using dynamic random-access memory (DRAM) as an example (even though many different types of memory can be used), the technology can allocate a few rows of a DRAM array to serve as a fast cache and/or registers for storing intermediate and/or temporary results of a calculation or for data prefetching for faster access or as an in-memory cache (e.g., see in-memory cache part 102 shown in FIG. 1). Using the same or a similar fabrication technology, a process can mask out rows for the fast cache and/or registers and make shallower caps (e.g., DRAM caps of different size). Such caps can be quick to fill with charge and quick to charge-share with data lines (or DLs) and can have matching or comparable resistance-capacitance (RC) time constant with the RC of DLs. In some circuits, in addition to resistance-capacitance, the time constant can have significant inductance L, which can facilitate or induce undesired current by inductive coupling or cross-talk. Thus, about it is to be understood that when RC in this description is used it also may refer to inductance-resistance-capacitance (LRC). Also, in some examples, with increased usage of super-conductive materials, inductance and capacitance can have more impact than a resistance in the circuits.

Further, to reduce the RC time constant of the DLs and make it match to the RC time constant of the cache, some embodiments can include shortening of DLs using a special word line (e.g., special WL with WL=0 (hold), WL=1 (read/write)) that cuts off the storage part of the array from the in-memory cache (such as when the cache is being accessed continuously). The special WL or "cut-off" WL can be based on the same technology as all other WLs except that it can create a pass transistor array.

In such examples, the pass transistor array can make access to storage slower, but it is used for long-stored slow bits anyways. Thus, increasing slowness or making latency higher may have little impactful to the system overall. However, there is a remedy to mitigate such an impact. The memory array can overcome the aforesaid problem of slowing down of the storage access by sharing a sense amplifier (SA) in the memory array—e.g., see FIG. 2. As shown in FIG. 2, the top SA array can access both storage arrays (one directly below and one through the in-memory cache and memory array above). Alternatively, the in-memory cache can be physically separate from storage in the memory hardware. However, this can take up more area of the hardware.

By sizing the storage and cache of the memory apparatus, the memory array can be a mixed array that uses fast bits close to an SA at single digit nanosecond access (e.g., 2-5 ns access) and slow bits further from the SA at double digit nanosecond access (e.g., 20-50 ns access). Thus, the sense amplifier array with computing elements can use cache for temporary and intermediate results. The retention of such results may be below a microsecond (1 us), but this is not a great concern because the result can be discarded since it is not a final result in a calculation usually. Also, the cache content (i.e., data stored in the cache) can be quickly refreshed with the fast latency corresponding to the cache access latency.

Example benefits of the in-memory cache described herein include the acceleration of a PIM computation, and generally fast access with low retention. For example, in-memory multiplication includes hundreds of back-and-forth memory accesses of an intermediate result. Thus, memory latency can significantly slowdown in-memory multiplication (and other forms of bit arithmetic) without the use of the in-memory caches described herein.

In some embodiments, the disclosed technology is directed to PIM in the form of an in-memory cache. In such embodiments and others, in-memory caches disclosed herein can include one or more rows of differently configured DRAM cells in an array of DRAM cells; thus, the DRAM device is a mixed DRAM device. In the mixed DRAM, the storage DRAM cells can be typical DRAM cells of varying types of typical DRAM cells, such as cells having ferroelectric elements. Although DRAM examples are described with more frequency than other types of memory, it is to be understood that the technologies described herein apply the other types of memory too (such other types of memory are described further herein).

The DRAM cells for the in-memory cache can have variations of properties that allow for faster access of data within the differently configured cells. For example, the differently configured DRAM cells can have shallower capacitors with little capacity to hold charge and; thus, quicker to fill up or drain the charge relative to the caps of the remainder of the DRAM cells in the mixed DRAM device (i.e., the storage DRAM cells). Capacity is not needed in the in-memory cache portion of a mixed DRAM array because cache is used in small time periods and retaining data for long time in the in-memory cache is not a difficult requirement to implement. Also, the DRAM with shallow caps can be replaced by another type of memory instead of using differently configured DRAM. For example, a type of memory that has less data access latency than DRAM can be used in the in-memory cache. With that said, it is to be understood, that the storage portion of the memory device or apparatus can include a first form of memory, and the in-memory cache portion of the device or apparatus can include a second form of memory that has faster data access properties than the first form of memory.

One of the problems to overcome in a memory apparatus having a regular storage part and an in-memory cache part (such as to implement PIM) is that the resistance-capacitance (RC) of each of the shallow caps or each of another type of data storage parts of the array of memory cells has to match or be comparable with the RC of corresponding bit lines or data lines (DLs). The disparity of such a mismatch may reflect as slower access or even data loss due to decreased sensitivity of voltage fluctuations at each DL. Such a problem can be overcome by shortening the bit lines or DLs with a "cut-off" word line (or "cut-off" WL) separating the sub-array of regular storage cells and the sub-array of in-memory cache cells (e.g., see cut-off part 106 shown in FIG. 1). The shortening of the bit lines or DLs can occur when the in-memory cache is being accessed.

Another example problem is that the "cut-off" WL can cause delays in accessing the storage cells because it causes a pass transistor array in the storage cells. This may cause a slowing of access of data in the storage cells, but at the same time there is a relative high increase speed of data access in the in-memory cache cells. However, such a slowdown can be reduced by sharing a sense amplifier (or SA) array of the memory cell array with the pass transistor array. In some embodiments, the sharing of the SA array can occur by stacking or tiling the memory cell array (e.g., see FIG. 2). In such embodiments and others, a first SA array can access multiple storage arrays (such as a storage cell array directly below the first SA array and one through an in-memory cache above the first SA array).

For PIM, as mentioned, it is often needed to store temporary results of a computation. The solutions disclosed herein can provide low-cost effective solution in a form of an in-memory cache. In a memory cell array, a specific portion of that array can be used as an in-memory cache. The array can include a "cut-off" part that can enhance the partitioning of the memory array into a storage part and an in-memory cache part (e.g., see FIG. 1). The in-memory cache can further be used for prefetching data into cache by memory array logic based on predictions or access pattern projections.

FIG. 1 illustrates example memory hardware 100 with an in-memory cache part 102 and an associated data storage part 104 (or in other words a backing store part), in accordance with some embodiments of the present disclosure. The in-memory cache part 102 and the storage part 104 are separated by a cut-off part 106 which can be made up of at least a special type of word line. Also shown in FIG. 1 is a sense amplifier array 108 configured to increase the speed of data access from at least the storage part 104 of the memory hardware 100. And, the sense amplifier array 108 can also be configured to increase the speed of data access from the in-memory cache part 102 of the memory hardware 100. Each section can include memory cells with a certain RC that is comparable with RC path to the sense amplifier. Thus, a section that is more proximate to SA may have smaller RC and therefore faster to access. Also, the sense amplifier array 108 can include or be a part of a chained array.

As mentioned, one of the problems to overcome in a memory apparatus having a regular storage part and an in-memory cache part (such as to implement PIM) is that the resistance-capacitance (RC) of each of the shallow caps or each of another type of data storage parts of the array of memory cells has to match or be a near match of the RC of corresponding bit lines or data lines (DLs). And, as mentioned, such a problem can be overcome by shortening the bit lines or DLs with a "cut-off" word line separating the sub-array of regular storage cells and the sub-array of in-memory cache cells (e.g., see cut-off part 106 shown in FIG. 1 as well as cut-off parts 106 and 206 shown in FIG. 2). In some embodiments, the shortening of the bit lines or DLs can occur when the in-memory cache is being accessed.

FIG. 2 illustrates example memory hardware 200 with multiple in-memory cache parts (e.g., see in-memory cache parts 102 and 202) and respective associated data storage parts or backing store parts (e.g., see storage parts 104 and 204), in accordance with some embodiments of the present disclosure. Each in-memory cache part and respective storage part are separated by a respective cut-off part which can be made up of at least a special type of word line (e.g., see cut-off parts 106 and 206). Also shown in FIG. 2 are multiple sense amplifier arrays configured to increase the speed of data access from at least the storage parts of the memory hardware 200 (e.g., see sense amplifier arrays 108 and 208). And, the sense amplifier arrays of the memory hardware 200 can also be configured to increase the speed of data access from the cache parts of the memory hardware 200.

As mentioned, an example problem of the "cut-off" WL or more generally the cut-off parts of the memory hardware is that such a portion of the memory hardware can cause delays in accessing the storage cells of the hardware because it causes a pass transistor array in the storage cells. As mentioned, this may cause a slowing of access of data in the storage cells, but at the same time there is a relative high increase speed of data access in the in-memory cache cells. However, such a slowdown can be reduced by sharing the one or more sense amplifier arrays of the memory hardware with the pass transistor array of the hardware (e.g., see sense amplifier arrays 108 and 208). As shown in FIG. 2, some embodiments can leverage the sharing of a sense amplifier array by stacking or tiling each memory cell array. In such embodiments, as shown by FIG. 2, a first sense amplifier array (e.g., see sense amplifier array 108) can access multiple storage arrays—such as a storage cell array directly below the first sense amplifier array (e.g., see storage part 204) and one through an in-memory cache above the first sense amplifier array (e.g., see storage part 104).

In some embodiments, the memory hardware 100 is, includes, or is a part of an apparatus having a memory array (e.g., see the combination of the in-memory cache part 102, the storage part 104, the cut-off part 106, and the sense amplifier array 108). The apparatus can include a first section of the memory array which includes a first sub-array of memory cells (such as a first sub-array of bit cells). The first sub-array of memory cells can include a first type of memory. Also, the first sub-array of memory cells can constitute the storage part 104. The apparatus can also include a second section of the memory array. The second section can include a second sub-array of memory cells (such as a second sub-array of bit cells). The second sub-array of memory cells can include the first type of memory with a configuration to each memory cell of the second sub-array that is different from the configuration to each cell of the first sub-array. The configuration can include each memory cell of the second sub-array having less memory latency than each memory cell of the first sub-array to provide faster data access. Also, the second sub-array of memory cells can constitute the in-memory cache part 102. The memory cells described herein can include bit cells, multiple-bit cells, analog cells, and fuzzy logic cells for example. In some embodiments different types of cells can include different types of memory arrays and sections described herein can be on different decks or layers of a single die. In some embodiments different types of cells can include different types of memory arrays and sections described herein can be on different dies in a die stack. In some embodiment such cell array formations can have hierarchy of various memory types.

The second sub-array of memory cells can constitute the in-memory cache part 102 or another type or form of in-memory cache. The second sub-array may be short-lived data or temporary data or something else to show that this data is for intermediate use or for frequent use or for recent use.

The in-memory cache can be utilized for PIM. In such examples, the apparatus can include a processor in a processing-in-memory (PIM) chip, and the memory array is on the PIM chip as well. Other use cases can include an in-memory cache for simply most recently and/or frequently used data in a computing system that is separate from the apparatus, virtual-physical memory address translation page tables, scratchpad fast memory for various applications including graphics, AI, computer vision, etc., and hardware for database lookup tables and the like.

In some embodiments, wherein the apparatus includes a processor in a PIM chip and the memory array is on the PIM chip or not, the processor can be configured to store data in the first sub-array of memory cells (such as in the storage part 104). The processor can also be configured to cache data in the second sub-array of memory cells (such as in the in-memory cache part 102).

In some embodiments, the first sub-array of memory cells (e.g., see storage part 104) can include DRAM cells. In such embodiments and others, the second sub-array of memory cells (e.g., see in-memory cache part 102) can include differently configured DRAM memory cells. Each memory cell of the second sub-array can include at least one of a capacitance, or a resistance, or a combination thereof that is smaller than at least one of a capacitance, or a resistance, or a combination thereof of each memory cell of the first sub-array. In some embodiments, the first sub-array of memory cells can include DRAM cells, and the second sub-array of memory cells can include differently configured DRAM memory cells, and the differently configured DRAM memory cells of the second sub-array can include respective capacitors with less charge storage capacity than respective capacitors of the DRAM memory cells of the first sub-array. Also, it is to be understood that a smaller cap size does not necessarily mean the data access from it is faster. Instead, not only the capacitance C, but rather the RC of a whole circuit (e.g., memory cell connected to bit line and their combined RC) can be a priority factor in designing faster arrays for faster data access. For example, in the second sub-array, either one or both of: combined capacitance of a memory cell, access transistor, and bit line and combined resistance of a memory cell, access transistor, and bit line of the second sub-array can be smaller than that of the first sub-array. This can increase the speed of data access in the second sub-array over the first sub-array.

In some embodiments, each cell of the first sub-array of memory cells can include a storage component and an access component. And, each cell of the second sub-array of memory cells is the same type of memory cell as a memory cell in the first sub-array but differently configured in that it can include a differently configured storage component and/or access component. Each memory cell of the second sub-array can include at least one of a capacitance, or a resistance, or a combination thereof that is smaller than at least one of a capacitance, or a resistance, or a combination thereof of each memory cell of the first sub-array. For an example of such embodiments see a part of a memory cell array 300 depicted in FIG. 3 or a part of a memory cell array 500 depicted in FIG. 5.

In some embodiments, a storage element function and access device element function can be combined in a single cell. Such memory cells can include phase-change memory (PCM) cells, resistive random-access memory (ReRAM) cells, 3D XPoint memory cells, and alike memory cells. For example, the first sub-array of memory cells can include 3D XPoint memory cells, and the second sub-array of memory cells can include differently configured 3D XPoint memory cells. For an example of such embodiments see a part of a memory cell array 400 depicted in FIG. 4 or a part of a memory cell array 600 depicted in FIG. 6.

In some embodiments, the first sub-array of memory cells can include flash memory cells, and the second sub-array of memory cells can include differently configured flash memory cells. And, each memory cell of the second sub-array can include at least one of a capacitance, or a resistance, or a combination thereof that is smaller than at least one of a capacitance, or a resistance, or a combination thereof of each memory cell of the first sub-array. For an example of such embodiments see a part of a memory cell array 700 depicted in FIG. 7.

In some embodiments, at least one of a capacitance, or a resistance, or a combination thereof of a memory cell, an access component (such as an access transistor, an access diode, or another type of memory access device), and a bit line of the second sub-array is smaller than at least one of a capacitance, or a resistance, or a combination thereof of a memory cell, an access component, and a bit line of the first sub-array.

In some embodiments, a special word line that separates the first sub-array of memory cells from the second sub-array of memory cells (e.g., see cut-off part 106). In such embodiments and others, the special word line creates a pass transistor array in the memory array (e.g., see a part of a memory cell array 300 and a part of a memory cell array 400 in FIGS. 3 and 4 respectively). In some embodiments, the special word line that separates the first sub-array of bit cells from the second sub-array of bit cells can include drivers or active devices (such as pull-up or pull-down transistors, signal amplifiers, repeaters, re-translators, etc.)—E.g., see FIGS. 5, 6 (e.g., drivers 502a and 502b). Inclusion of such drivers or active devices can make the word line (or WL) a signal amplifying word line.

FIGS. 3-7 show aspects of the special word lines in greater detail and such word lines can be a part of the cut-off parts shown in FIGS. 1 and 2 (e.g., see cut-off parts 106 and 206). Also, multiple special word lines can be used with multiple sub-arrays. And, such special word lines can also be used with NAND flash memory (e.g., see FIG. 7). A special word line can include a transistor, driver (such as a pull-up driver), a diode, or another type of circuit device, or a combination thereof that can at least split a bit line into two or more sections such that split sections can be connected and disconnected on demand. The special WL can be made of the same components as the access components of the memory cells in some embodiments (such as the same type of materials). In some embodiments, the devices of the special word lines can be less resistive and/or capacitive when its ON and less charge leaky when its OFF.

In some examples, the RC of the memory cell can be much smaller than the RC of the access component and the bit line, and in such cases, there may not be enough charge in the memory cell to sense. However, a proximity of a sense amplifier (or SA) to the memory cell can increase the charge sensitivity; thus, such embodiments can include an SA to improve the charge sensing of the memory cell (e.g., see sense amplifier arrays 108 and 208 shown in FIGS. 1 and 2 as well as sense amplifier 340 shown in FIGS. 3-7). Thus, in some embodiments of the apparatus, an SA array located proximate to the first section of memory array (e.g., see section with cells 328 or 329) would allow to design such cells with smaller RC. Also, the memory cells located in the next section (e.g., see cells 326) can be designed with slightly larger RC. Memory cells in other and more remote sections can be designed with even larger RC (e.g., see cells 324). Such cells can be slower than others in a more proximate section to the SA array. World lines with active components (e.g., see drivers 502a and 502b) can allow to amplify cell signal on a way to SA, and can allow to reduce cells RC or the remote cells. However, the active components may also introduce latency.

A sense amplifier array in the apparatus can be shared by the second section of the memory array and another first section of another memory array of the apparatus (e.g., see sense amplifier array 108 as shown in FIG. 2). And, the other first section of the other memory array of the apparatus can include another first sub-array of memory cells that includes memory cells of the first type of memory. In such embodiments and others, the shared sense amplifier array can speed-up access through the transistor array or other devices in the apparatus used for accessing the memory cell for data or can speed-up access through a special word line and its devices.

In some embodiments, for example, the other first section of the other memory array is such that it does not have a pass transistor of a word line which introduces latency. Thus, the other first section can be faster at data access than accessing the first section directly connected to the special word line but slower than accessing the second section. Thus, the nearest sense amplifier array can increase speed in access of data from the first sub-array, the second sub-array, or the first sub-array of the other memory array. The other memory array can also be a part of the apparatus in some embodiments.

Alternatively, a sense amplifier can be included in addition or instead of a special word line and it can access proximate sub-arrays accordingly. See FIGS. 3-7. Such an approach can also be applied to the multiple sets of sub-arrays shown in FIG. 2. Special word lines in the cut-off parts 106 and 206 can be replaced with sense amplifiers or the cut-off parts can include a combination of special word lines and sense amplifiers (e.g., see FIGS. 3-7).

As alternatives to the aforementioned embodiments or in combination with the aforementioned embodiments, the memory array can include, be, or be a part of an apparatus wherein the first section of the memory array includes a first type of memory and the second section of the memory array include a second type of memory. This is instead of the second section of the memory array including a different configuration of the first type of memory. In such embodiments, the first section of the memory array can include a first sub-array of memory cells (such as a first sub-array of bit cells) having a first type of random-access memory or a first type of another type of memory. And, the second section of the memory array can include a second sub-array of memory cells (such as a second sub-array of bit cells or multi-bit cells) having a second type of random-access memory or a second type of another type of memory. Similarly, in such embodiments, each memory cell of the second sub-array of memory cells has less memory latency than each memory cell of the first sub-array of memory cells to provide faster data access.

In such embodiments and others, the first sub-array of memory cells can include ferroelectric memory cells, and the second sub-array of memory cells can include DRAM cells. In some embodiments, the first sub-array of memory cells can include ferroelectric transistor random-access memory (FeTRAM) cells, and the second sub-array of memory cells can include DRAM cells or SRAM cells.

In such embodiments and others, the first sub-array of memory cells can include memory cells of a different type from DRAM cells, and the second sub-array of memory cells can include DRAM cells. Alternatively, the first sub-array of memory cells can include flash memory cells, and the second sub-array of memory cells can include memory cells of a different type from flash memory cells.

In such embodiments and others, the apparatus having different memory types can also include a processor in a PIM chip, and the memory array can be on the PIM chip too. The processor can be configured to: store data in the first sub-array of memory cells; and cache data in the second sub-array of memory cells.

In such embodiments and others, the memory cells of the second sub-array of memory cells can include respective capacitors with less charge storage capacity than respective capacitors of the memory cells of the first sub-array of memory cells. And, in such embodiments and others, at least one of a capacitance, or a resistance, or a combination thereof of a memory cell, an access component (such as an access transistor, an access diode, or another type of memory access device), and a bit line of the second sub-array is smaller than at least one of a capacitance, or a resistance, or a combination thereof of a memory cell, an access component, and a bit line of the first sub-array.

In such embodiments and others, the memory cells of the second sub-array of memory cells can include respective resistors requiring less power to change their state than respective resistors of the memory cells of the first sub-array of memory cells. Thus, requiring smaller voltage to write or change these resistance states, such as high-resistance state or low resistance state. And, in such embodiments and others, at least one of a capacitance, or a resistance, or a combination thereof of a memory cell, an access component (such as an access transistor, an access diode, or another type of memory access device), and a bit line of the second sub-array is smaller than at least one of a capacitance, or a resistance, or a combination thereof of a memory cell, an access component, and a bit line of the first sub-array.

In such embodiments and others, the apparatus can include a special word line that separates the first sub-array of memory cells from the second sub-array of memory cells. The special word line can form a pass transistor array in the memory array.

In such embodiments and others, the apparatus can include sense amplifier array, and the SA array can be shared by the second section of the memory array and another first section of another memory array of the apparatus. The other first section of the other memory array of the apparatus can include another first sub-array of memory cells which can be made up of either the first type of memory or the second type of memory.

In some embodiments, the memory cells can have at least one of a transistor, a diode, or a ferroelectric capacitor, or a combination thereof. In some embodiments, the memory cells can include mixed random-access memory cells. For example, the first sub-array of bit cells can be mixed random-access memory bit cells, and the second sub-array of bit cells can include DRAM bit cells. Also, the second sub-array of bit cells can include DRAM bit cells, and the first sub-array of bit cells can include bit cells of other type than DRAM bit cells. Also, the first sub-array of bit cells can include flash memory bit cells, and the second sub-array of memory cells can include bit cells other than flash memory bit cells.

In some embodiments, a storage element function and access device element function can be combined in a single cell of the arrays. Such memory cells can include PCM cells, ReRAM cells, 3D XPoint memory cells, and alike memory cells. For example, the first sub-array of memory cells can include 3D XPoint memory cells, and the second sub-array of memory cells can include differently configured 3D XPoint memory cells.

In some embodiments, the memory hardware 100 is, includes, or is a part of an apparatus having a memory array (e.g., see the combination of the in-memory cache part 102, the storage part 104, the cut-off part 106, and the sense amplifier array 108). The memory array can include a first memory array that includes a first section, having a first sub-array of memory cells (such as a first sub-array of bit cells) can be made up of a type of memory. The first memory array can also include a second section, having a second sub-array of memory cells (such as a second sub-array of bit cells) made up of the same type of memory with a configuration to each memory cell of the second sub-array that is different from the configuration to each cell of the first sub-array. The configuration can include each memory cell of the second sub-array of memory cells having less memory latency than each memory cell of the first sub-array of memory cells to provide faster data access.

The memory array in such embodiments can also include a second memory array. The second memory array can include another first section, having a first sub-array of memory cells made up of the same type of memory. The second memory array can also include a second section, having another second sub-array of memory cells made up of the same type of memory with a configuration to each memory cell of the second sub-array that is different from the configuration to each cell of the first sub-array. Also, the memory array can include a sense amplifier array configured to be shared by the second section of the first memory array and the other first section of second memory array (e.g., see sense amplifier array 108 as shown in FIG. 2).

FIG. 3 illustrates a part of a memory cell array 300 that can at least partially implement an in-memory cache and that has pass transistors (e.g., see pass transistors 302a and 302b) as well as access transistors (e.g., see access transistors 304a, 304b, 306a, 306b, 308a, 308b, 309a, and 309b), in accordance with some embodiments of the present disclosure. Shown in FIG. 3, in the part of the memory cell array 300, are multiple sections of a bit line of the memory cell array. Each section of the bit line has its own RC (e.g., see sections of the bit line 314, 316, 318, and 319). Also, shown are bit cells for each section of the bit line (e.g., see bit cells 324a, 324b, 326a, 326b, 328a, 328b, 329a, and 329b). Only two bit cells are shown per section of the bit line; however, it is to be understood that any number of bit cells could be included with each section of the bit line. Also, only one bit line is shown; however, it is to be understood that any number of bit lines could be included in the memory cell array shown in FIG. 3. Each bit line can have an associated SA. Alternatively, more than one bit line can be multiplexed to a single SA via a multiplexing device, such that there are fewer SAs than bit lines.

As depicted in FIG. 3, each access transistor is part of a respective word line (e.g., see access transistors 304a, 304b, 306a, 306b, 308a, 308b, 309a, and 309b and see word lines 334a, 334b, 336a, 336b, 338a, 338b, 339a, and 339b). And, as shown, each pass transistor (e.g., see pass transistors 302a and 302b) is part of a section of a respective special word line (e.g., see special word lines 330a and 330b). Each section can include memory cells with a certain RC that is comparable with RC path to the sense amplifier. Thus, a section that is more proximate to an SA may have smaller RC and therefore can be faster to access.

The respective special word lines (e.g., see special word lines 330a and 330b) constitute a cut-off part for an in-memory cache part and a storage part of the memory hardware (e.g., see cut-off parts 106 and 206 depicted in FIGS. 1 and 2). In other words, the cut-off part creates pass transistors. As mentioned herein, such transistors can slowdown access to the memory cells of the hardware. However, as shown in FIG. 3, the part of the memory cell array 300 also includes a sense amplifier 340 of a sense amplifier array that can offset the slowdown of the access of the memory cells. Also, in FIGS. 5 and 6, special word lines with active components can increase access speed.

In FIG. 3, bit cells 324a, 324b, 326a, 326b, 238a, and 328b can be cells of a storage part of a first memory array separated by a sense amplifier array from bit cells 329a and 329b of an in-memory cache part of a second memory array (e.g., see FIG. 2, wherein bit cells 324a, 324b, 326a, 326b, 238a, and 328b could be part of storage part 204 and bit cells 329a and 329b could be part of in-memory cache part 102).

Figure 4:
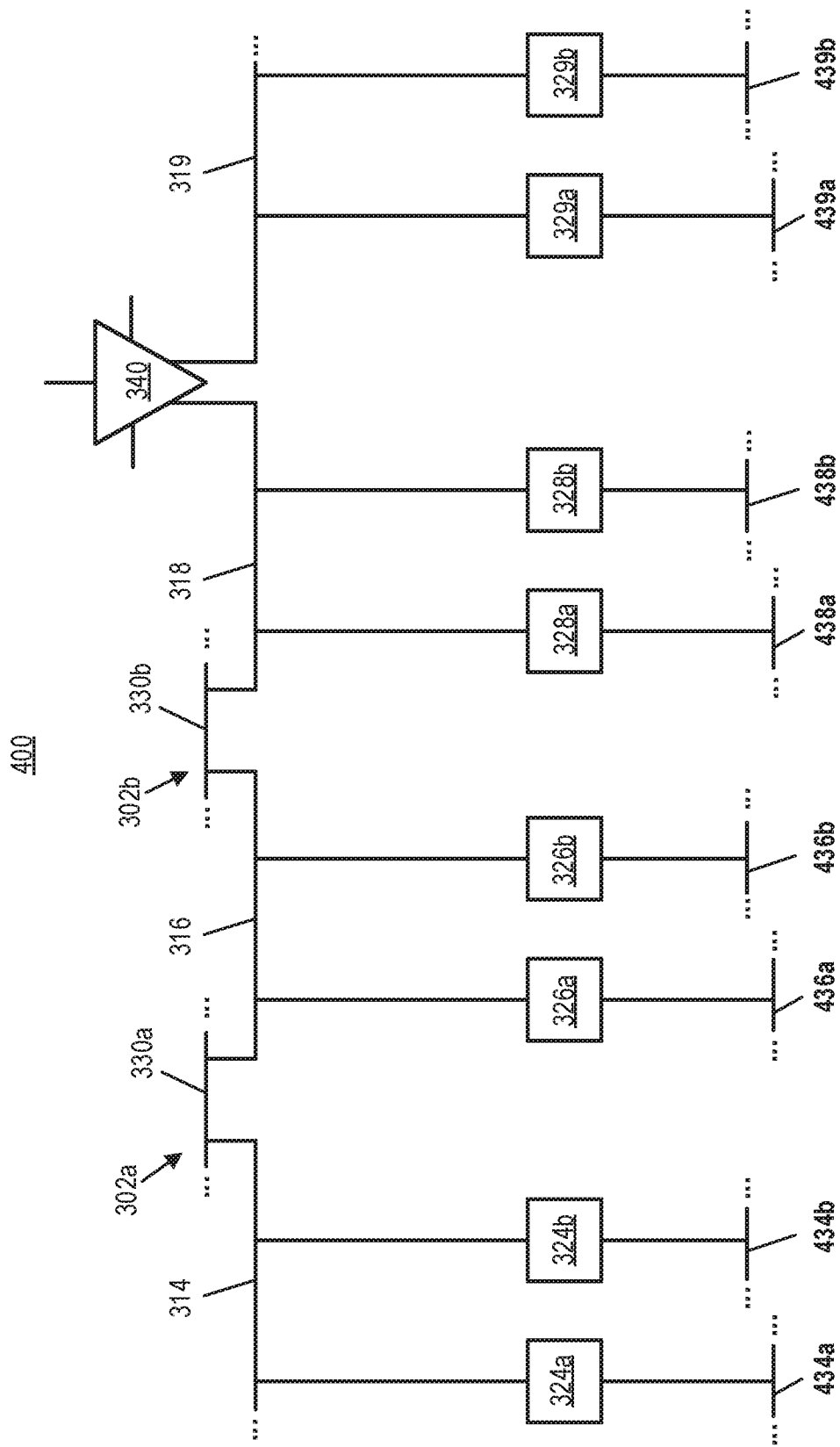
FIG. 4 illustrates a part of a memory cell array that can at least partially implement an in-memory cache and that has pass transistors but does not have access transistors, in accordance with some embodiments of the present disclosure.

FIG. 4 illustrates a part of a memory cell array 400 that can at least partially implement an in-memory cache and that has pass transistors (e.g., see pass transistors 302a and 302b) but does not have access transistors, in accordance with some embodiments of the present disclosure. Analogous to FIG. 3, in FIG. 4, the part of the memory cell array 400 includes multiple sections of a bit line of the memory cell array. Likewise, each section of the bit line has its own RC (e.g., see sections of the bit line 314, 316, 318, and 319). Also, similarly, shown are bit cells for each section of the bit line (e.g., see bit cells 324a, 324b, 326a, 326b, 328a, 328b, 329a, and 329b). Similar to FIG. 3, only two bit cells are shown per section of the bit line; however, it is to be understood that any number of bit cells could be included with each section of the bit line. Also, only one bit line is shown (which is similar to FIG. 3); however, it is to be understood that any number of bit lines could be included in the memory cell array shown in FIG. 4.

Similar to FIG. 3, in FIG. 4, each pass transistor is part of a section of a respective special word line (e.g., see special word lines 330a and 330b). The respective special word lines constitute a cut-off part for an in-memory cache part and a storage part of the memory hardware. In other words, the cut-off part creates pass transistors which can slowdown access to the memory cells of the hardware. However, as shown in FIG. 4, the part of the memory cell array 400 also includes a sense amplifier 340 of a sense amplifier array that can offset the slowdown of the access of the memory cells.

Not similar to FIG. 3, in FIG. 4, the part of the memory cell array 400 has no access transistors; thus, such transistors cannot be a part of respective word lines. As shown in FIG. 4, the regular word lines of the part of the memory cell array 400 are connected to each bit cell directly without being connected via an access transistor (e.g., see word lines 434a, 434b, 436a, 436b, 438a, 438b, 439a, and 439b). Memory types that do not include access transistors can include PCM, ReRAM, 3D XPoint memory, and similar types of memory. Such memory can be programmed or sensed by passing current through cells or by applying a certain voltage to sense or program resistivity of cells.

Figure 5:
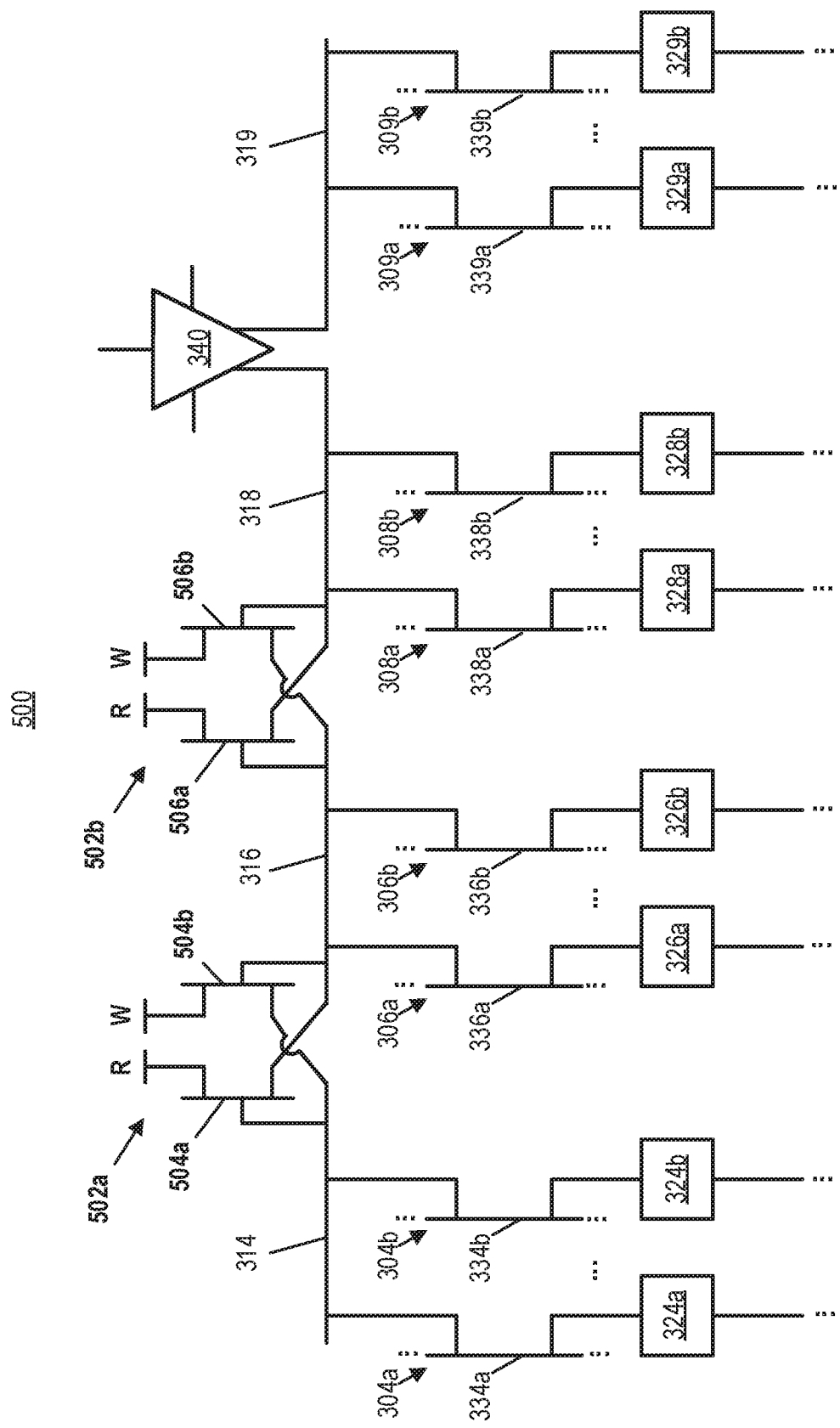
FIG. 5 illustrates a part of a memory cell array that can at least partially implement an in-memory cache and wherein the array has access transistors and drivers are used instead of pass transistors, in accordance with some embodiments of the present disclosure.

FIG. 5 illustrates a part of memory cell array 500 that can at least partially implement an in-memory cache and wherein the array has access transistors (e.g., see access transistors 304a, 304b, 306a, 306b, 308a, 308b, 309a, and 309b) as well as drivers or active devices (e.g., see drivers 502a and 502b, or e.g., amplifiers, re-translators, etc.) are used instead of pass transistors, in accordance with some embodiments of the present disclosure. The part of memory cell array 500 at least differs from the parts of the arrays in FIGS. 3 and 4 in that it has drivers instead of pass transistors. Specifically, FIG. 5 shows the part of the array 500 having pull-up based drivers. Each of the drivers has two enable lines. The lines labeled "R" are for reading memory cells and the lines labeled "W" are for writing to the cells.

Similar to FIG. 3, shown in FIG. 5, in the part of the memory cell array 500, are multiple sections of a bit line of the memory cell array. Each section of the bit line has its own RC (e.g., see sections of the bit line 314, 316, 318, and 319). Also, shown are bit cells for each section of the bit line (e.g., see bit cells 324a, 324b, 326a, 326b, 328a, 328b, 329a, and 329b). Also, as depicted in FIG. 5, each access transistor is part of a respective word line (e.g., see access transistors 304a, 304b, 306a, 306b, 308a, 308b, 309a, and 309b and see word lines 334a, 334b, 336a, 336b, 338a, 338b, 339a, and 339b).

Different from FIG. 3, FIG. 5 does not depict a memory array having pass transistors made up from special word lines. Instead as shown, the special word lines of the part of the memory cell array 500 can include drivers (e.g., see drivers 502a and 502b). Each driver is part of a section of a respective special word line (e.g., see a first special word line that includes transistors 504a and 504b and a second special word line that includes transistors 506a and 506b). The transistors 504a and 506a are transistors in lines for reading memory cells in respective special word lines. The transistors 504b and 506b are transistors in lines for writing to memory cells in the respective special word lines.

Similar to the arrays in FIGS. 3 and 4, the respective special word lines of the part of the memory cell array 500 constitute a cut-off part for an in-memory cache part and a storage part of the memory hardware (e.g., see cut-off parts 106 and 206 depicted in FIGS. 1 and 2). In other words, the cut-off part creates the depicted drivers to some extent. The transistors in the drivers can slowdown access to the memory cells of the hardware; however, they can amplify signal travelling through the length of bit line and keep signal integrity and improve sensitivity. As shown in FIG. 5, the part of the memory cell array 500 also includes a sense amplifier 340 of a sense amplifier array that can sense the memory cells and can write data to them via bit lines. Also, similarly, in FIG. 5, bit cells 324a, 324b, 326a, 326b, 238a, and 328b can be cells of a storage part of a first memory array separated by a sense amplifier array from bit cells 329a and 329b of an in-memory cache part of a second memory array (e.g., see FIG. 2, wherein bit cells 324a, 324b, 326a, 326b, 238a, and 328b could be part of storage part 204 and bit cells 329a and 329b could be part of in-memory cache part 102).

Figure 6:
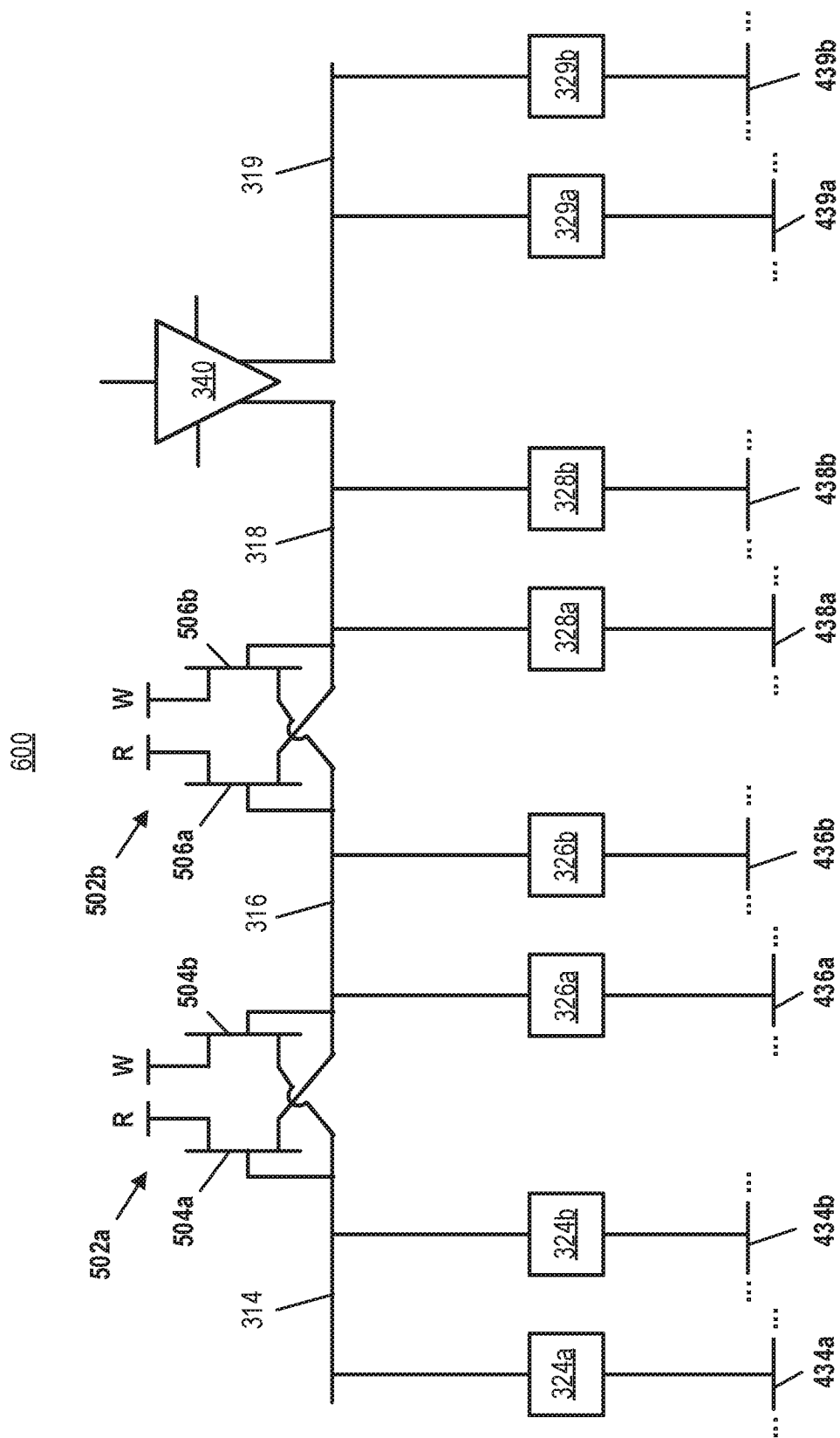
FIG. 6 illustrates a part of a memory cell array that can at least partially implement an in-memory cache and wherein access transistors are not used and drivers are used instead of pass transistors, in accordance with some embodiments of the present disclosure.

FIG. 6 illustrates a part of memory cell array 600 that can at least partially implement an in-memory cache and wherein access transistors are not used and drivers are used instead of pass transistors (e.g., see drivers 502a and 502b shown in FIG. 6), in accordance with some embodiments of the present disclosure. The part of the memory cell array 600 is a combination of parts of the memory cell arrays 400 and 500. It is similar to the part of the array of FIG. 5 in that the part of the memory cell array 600 has drivers instead of pass transistors, and the drivers in FIG. 6 are similar to the drivers in FIG. 5. It is similar to the part of the array of FIG. 4 in that the part of the memory cell array 600 does not have access transistors and its regular word lines are directly connected to its memory cells (e.g., see bit cells 324a, 324b, 326a, 326b, 328a, 328b, 329a, and 329b and see word lines 434a, 434b, 436a, 436b, 438a, 438b, 439a, and 439b). Also, the part of the memory cell array 600 can include a memory array with cells without transistors on one side and cells with transistors on another side.

Figure 7:
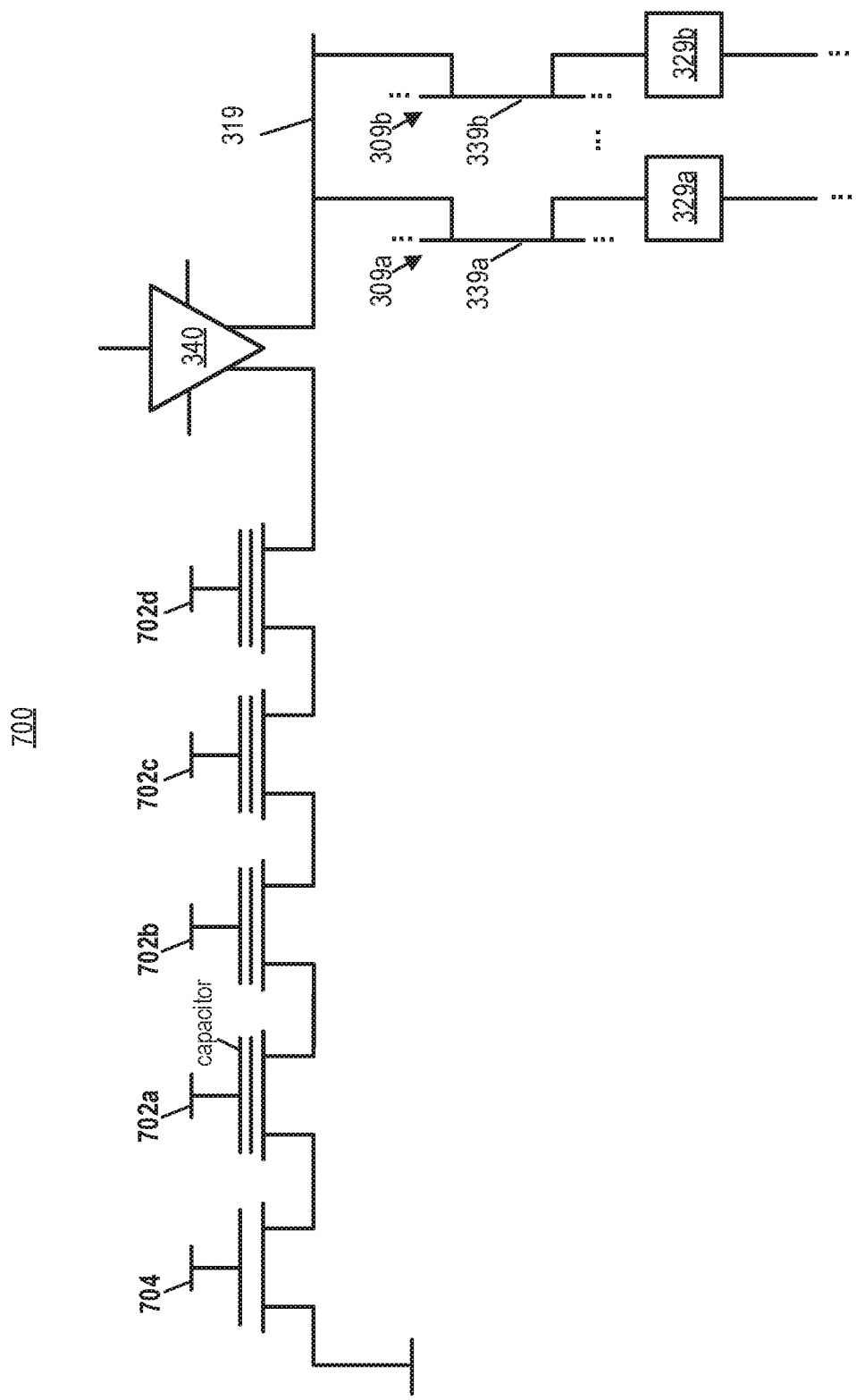
FIG. 7 illustrates a part of a memory cell array of NAND flash memory that can at least partially implement an in-memory cache.

FIG. 7 illustrates a part of memory cell array of NAND flash memory 700 that can at least partially implement an in-memory cache. For NAND Flash, each gate of access transistor stores certain charge and can be read by applying certain voltage that thresholds the cell. The higher the voltage, the more charge needs to be applied to the cells. The higher the number of cells in the string, the longer the latency of applying such voltage. The memory apparatus can leverage the length of a NAND string connected to a sense amplifier of the sense amplifier array of the apparatus (e.g., see sense amplifier 340). The shorter a NAND string is, the faster it can be accessed because RC of the path becomes smaller. This functionality can be accomplished by having multiple pieces of NAND string separated by SAs or active components. In addition, a single SA can interface multiple NAND strings and a section of array of another memory type that can be used as a cache. For simplicity sake, bit cells 329a and 329b are shown with corresponding components such as the section of the bit line 319, access transistors 309a and 309b, and word lines 339a and 339b. Such bit cells can be cells of the in-memory cache parts shown in FIGS. 1 and 2. In addition, for NAND Flash, each word line (e.g., see word lines 702a, 702b, 702c, and 702d) can be, include or be a part of a special word line. In some embodiments, such as the embodiment shown in FIG. 7, a potential difference can be generated across each NAND transistor by locking electronic charge of different values or polarities at each transistor-transistor connection (e.g., bit line segments between world lines). In such embodiments, the memory apparatus can leverage the proximity of a NAND cell to an SA by sensing charge across a specific transistor without electronic current flow throughout the whole NAND string.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
  a memory array, comprising a plurality of memory cells, the memory cells comprising dynamic random-access memory (DRAM) cells;
  a first section of the memory array comprising a first subset of the memory cells having a first configuration; and
  a second section of the memory array comprising a second subset of the memory cells having a second configuration, the second configuration configured to reduce memory latency with respect to the first configuration and wherein each memory cell of the second section comprises at least one of a capacitance, or a resistance, or a combination thereof that is smaller than at least one of a capacitance, or a resistance, or a combination thereof of each memory cell of the first section.

2. The apparatus of claim 1, comprising a processor in a processing-in-memory (PIM) chip, and wherein the memory array is on the PIM chip.

3. The apparatus of claim 2, wherein the processor is configured to: store data in the first section of the memory array; and cache data in the second section of the memory array.

4. The apparatus of claim 1, wherein each memory cell of the first section of the memory array comprises a storage component and an access component.

5. The apparatus of claim 1, comprising a special word line that separates the first section of the memory array from the second section of the memory array.

6. The apparatus of claim 5, comprising a sense amplifier (SA) array, wherein the SA array is shared by the second section of the memory array and a third section of another memory array of the apparatus, and wherein the other first third section comprises a third subset of the memory cells having a first configuration.

7. An apparatus, comprising:
a first memory array comprising a plurality of memory cells, the plurality of memory cells comprising dynamic random-access memory (DRAM) cells, the first memory array comprising:
- a first section of the first memory array comprising a first subset of the first plurality of memory cells having a first configuration, and
- a second section of the first memory array comprising a second subset of the first plurality of memory cells having a second configuration, the second configuration configured to reduce memory latency with respect to the first configuration and wherein each memory cell of the second section comprises at least one of a capacitance, or a resistance, or a combination thereof that is smaller than at least one of a capacitance, or a resistance, or a combination thereof of each memory cell of the first section;

a second memory array comprising a second plurality of memory cells, the second plurality of memory cells comprising DRAM cells, the second memory array comprising:
- a first section of the second memory array comprising a third subset of the second plurality of memory cells arranged in the first configuration, and
- a second section of the second memory array comprising a fourth subset of the second plurality of memory cells arranged in the second configuration; and a sense amplifier (SA) array configured to be shared by the second section of the first memory array and the first section of second memory array.

* * * * *